(12) United States Patent
van der Vleuten et al.

(10) Patent No.: US 6,919,830 B1
(45) Date of Patent: *Jul. 19, 2005

(54) ARITHMETIC DECODING OF AN ARITHMETICALLY ENCODED INFORMATION SIGNAL

(75) Inventors: Renatus Josephus van der Vleuten, Veldhoven (NL); Bernardus Antonius Maria Zwaans, Rosmalen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 201 days.

This patent is subject to a terminal disclaimer.

(21) Appl. No.: 10/393,432

(22) Filed: Mar. 20, 2003

Related U.S. Application Data

(63) Continuation of application No. 10/144,814, filed on Oct. 25, 2001, now Pat. No. 6,580,379, which is a continuation of application No. PCT/EP01/02347, filed on Mar. 1, 2001.

(30) Foreign Application Priority Data

Mar. 7, 2000 (EP) .............................................. 00200805

(51) Int. Cl.$^7$ .............................................. H03M 7/00
(52) U.S. Cl. ........................................ 341/107; 341/50
(58) Field of Search ......................... 341/107, 50, 51; 382/244, 247, 233; 702/181

(56) References Cited

U.S. PATENT DOCUMENTS

| | | | |
|---|---|---|---|
| 5,825,782 A | * | 10/1998 | Roohparvar ................ 714/718 |
| 6,144,320 A | | 11/2000 | Van Der Vleuten et al. .. 341/50 |
| 6,269,338 B1 | | 7/2001 | Bruekers et al. ............ 705/500 |
| 6,285,795 B1 | * | 9/2001 | Cho ........................... 382/243 |
| 6,289,306 B1 | | 9/2001 | Van Der Vleuten et al. ............. 704/219 |
| 6,560,368 B1 | * | 5/2003 | Brown et al. ................ 382/239 |
| 6,580,379 B2 | * | 6/2003 | Van Der Vleuten et al. ..... 341/107 |

FOREIGN PATENT DOCUMENTS

| | | | | |
|---|---|---|---|---|
| EP | 0895361 A2 | 2/1999 | ............ H03M/7/40 |
| WO | WO9949579 | 9/1999 | ............ H03M/7/40 |

OTHER PUBLICATIONS

G.G. Langdon, "An Introduction to Arithmetic Coding", IBM J. Res. Development, vol. 28, p. 135–149, Mar. 1984.

P. Bruekers et al., "Improved Lossless Coding of 1-bit Audio Signals", Presented at $103^{rd}$ Convention of the AES, Sep. 26–29, 1997, New York, preprinted 4563 (I–6).

"Speed-Up Mode for Q-Coder Software Implementation", IBM Technical Disclosure Bulletin, US, IBM Corp., New York, vol. 32, No. 8B, 1990, pp. 17–20, XP000082193.

* cited by examiner

*Primary Examiner*—Brian Young
(74) *Attorney, Agent, or Firm*—Edward W. Goodman

(57) ABSTRACT

In order to improve an arithmetic decoder, the method of arithmetically decoding an arithmetically encoded information signal into an information signal including a serial sequence of n-bit symbols, is adapted to decode two subsequent symbols of the information signal in one decoding cycle if the first symbol to be decoded has the most probable symbol.

15 Claims, 5 Drawing Sheets

ARITHMETIC DECODING OF AN ARITHMETICALLY ENCODED INFORMATION SIGNAL

CROSS-REFERENCE TO RELATED APPLICATIONS

This is a continuation of pending U.S. patent application Ser. No. 10/144,814, filed Oct. 25, 2001, now U.S. Pat. No. 6,580,379, hereby incorporated in whole by reference which is a continuation of PCT/EP01/02347 filed on Mar. 1, 2001.

BACKGROUND OF THE INVENTION

1. Field of the Invention

The invention relates to a method of arithmetically decoding an arithmetically encoded information signal into an information signal comprising a serial sequence of n-bit symbols, where n is an integer and n=1, the method comprising the steps of:
(a) receiving the arithmetically encoded information signal,
(b) retrieving, from finite-size first and second registers, values for an A and a C parameter, respectively, the A parameter having a relationship with the size of a value interval, the C parameter having a relationship with a boundary of said interval,
(c) generating at least one probability value for an associated symbol to be decoded,
(d) deriving a symbol in response to the at least one probability value, and in response to the values for A and C retrieved from said first and second registers, respectively,
(e) updating at least the A parameter in order to obtain the new size of the interval for decoding the next symbol of the information signal,
(i) outputting the decoded symbol,
(j) as the case may be,
   renormalizing the updated A parameter so as to obtain a renormalized A parameter, and
   updating the C parameter so as to obtain an updated C parameter,
(k) storing the A parameter and the C parameter obtained in step
(j) in the first register and the second register, respectively.

The invention also relates to an apparatus for decoding the arithmetically encoded information signal.

2. Description Of The Related Art

The method defined in the opening paragraph is known from International Patent Application No. WO 99/49579, corresponding to U.S. Pat. No. 6,144,320 (PHN 16.822). Arithmetic coding is a well-known technique for lossless coding, and an introduction can be found in any current source-coding book. For a thorough understanding of the implementations of arithmetic coding that are most relevant for the current work, the reader is referred to [Lang84]. The history of arithmetic coding is comprehensively described in the appendix of said document.

The known method sequentially decodes symbols retrieved from the encoded information signal so as to obtain decoded symbols. The implementation of arithmetic coding, that is the subject of the present invention, uses two finite-size registers, which are usually called C and A. The decoder flow diagram is shown in FIG. 1. FIG. 2 shows the flow diagram for the "Output symbol . . . " block shown in FIG. 1, for the case binary symbols have to be decoded. MPS and LPS are the most probable symbol and least probable symbol, respectively. Parameter p is the probability of the LPS. The value of the bit that is decoded is put in b. FIG. 3 shows a flow diagram of the decoder block denoted "Renormalize . . . " in FIG. 1. The blocks in the decoder flow diagram in FIG. 1 are normally implemented in dedicated hardware to enable the received information to be decoded signal real-time. FIG. 1 shows a loop. When the decoding process executes the loop one time, one decoded symbol is outputted. The time needed to obtain one decoded symbol depends on the time needed to execute the three operations in the loop shown in FIG. 1. The execution of an operation should not be started until the execution of a previous operation in the loop has been finalized. To decrease the execution time, the decoder is implemented in dedicated hardware. In a software implementation, the execution time of the "Renormalize A . . . " block is related to the value of the A parameter. FIG. 3 shows that depending on the value of A, the loop has to be executed a number of times. For example, for the application of SACD, the maximum number of times the loop may be executed is seven times. However, when implemented in dedicated hardware, the execution time is related to the worst case situation and thus to the situation the loop has to be executed that the maximum number of times. Since the worst case situation occurs only a few times in the decoding process, the "Renormalize A . . . " block is a limiting factor for the time needed to sequentially obtain one decoded symbol.

SUMMARY OF THE INVENTION

The invention aims at improving the above-described arithmetic decoders. In accordance with the invention, the method of arithmetically decoding an arithmetically encoded information signal into an information signal comprising a serial sequence of n-bit symbols, n being an integer for which n≧1, the method being adapted to obtain two subsequent output symbols from the information signal in one decoding cycle, comprises the steps of:
(a) receiving the arithmetically encoded information signal,
(b) retrieving, from finite-size first and second registers, values for an A and a C parameter, respectively, the A parameter having a relationship with the size of a value interval, the C parameter having a relationship with a boundary of said interval,
(c) generating a first probability value for a first symbol to be decoded, said first probability value indicating the probability that the first symbol has a least probable value, and generating a second probability value for a subsequent symbol to be decoded, said second probability value indicating the probability that the second symbol has the least probable value, the first symbol to be decoded being assumed to have the most probable value,
(d) deriving the first symbol in response to the said first probability value, and in response to the values for A and C retrieved from said first and said second registers, respectively,
(e) updating the A parameter so as to obtain an updated A parameter,
(f) updating the value for A retrieved from said first register to a value for a temporary A parameter, using the assumption that the first symbol obtained from decoding has the most probable value,
(g) deriving a temporary C parameter from the C parameter retrieved from said second register,
(h) deriving the second symbol in response to the said second probability value, and in response to the values of the temporary A parameter and the temporary C parameter,
(i) outputting both the first and the second symbol when the first symbol has the most probable value or outputting the first symbol only if the first symbol has the least probable value, (j) deriving new A and C parameters,
(k) storing the new A and C parameter in the first and second register, respectively.

The invention is based on the following recognition. At the beginning of the execution of the loop, the value of the A parameter is $\geq \frac{1}{2}$ and $<1$. The probability value for the first symbol to be decoded being a least probable symbol value, is $p1 \leq \frac{1}{2}$. When, assuming that the first symbol to be decoded has the most probable symbol value, the next value of the A parameter, according to the flow diagram in FIG. 2, will be A–Z, wherein Z=A*p1. Thus, the next value of A=A*(1−p1) and, therefore, $\frac{1}{4} \leq$ the next value of A<1. This means that when the first symbol to be decoded has the most probable symbol value, the loop in the "Renormalize A . . . " block has to be executed at most once. The time to execute this "Renormalize A . . . " function in dedicated hardware will be much shorter than the time to execute the "Renormalize A . . . " function when decoding only one symbol per decoding cycle, this execution time depending on the maximum number of times the loop in said function could be executed. Thus, in the case that the first output symbol of two subsequent output symbols has the MPS value, the time required to obtain said subsequent output symbols will be shorter than the time required to obtain each of the output symbols sequentially by decoding one output symbol per decoding cycle according to the prior art decoding method.

Therefore, in accordance with the invention, the prior-art decoding method in which one output symbol per decoding cycle is obtained is performed, and a method in which two output symbols per decoding cycle are obtained, assuming that the first symbol to be decoded has the most probable value, is performed in parallel. Depending on the symbol value of the first decoded symbol, one or two decoded symbols will be obtained per decoding cycle. As a result of the parallel execution of the steps to determine one decoded output symbol and the steps to determine two decoded output symbols, assuming that the first output symbol has the MPS value, the time to decoded an encoded information signal is reduced.

BRIEF DESCRIPTION OF THE DRAWINGS

These and other aspects of the invention will be described in more detail hereafter with reference to the drawings, in which:

" in FIG. 1, for the binary case, the LPS probability being p and the value of the bit that is decoded being put in b;

" in FIG. 1;

" in FIG. 4.

DESCRIPTION OF THE PREFERRED EMBODIMENTS

Figure 4:
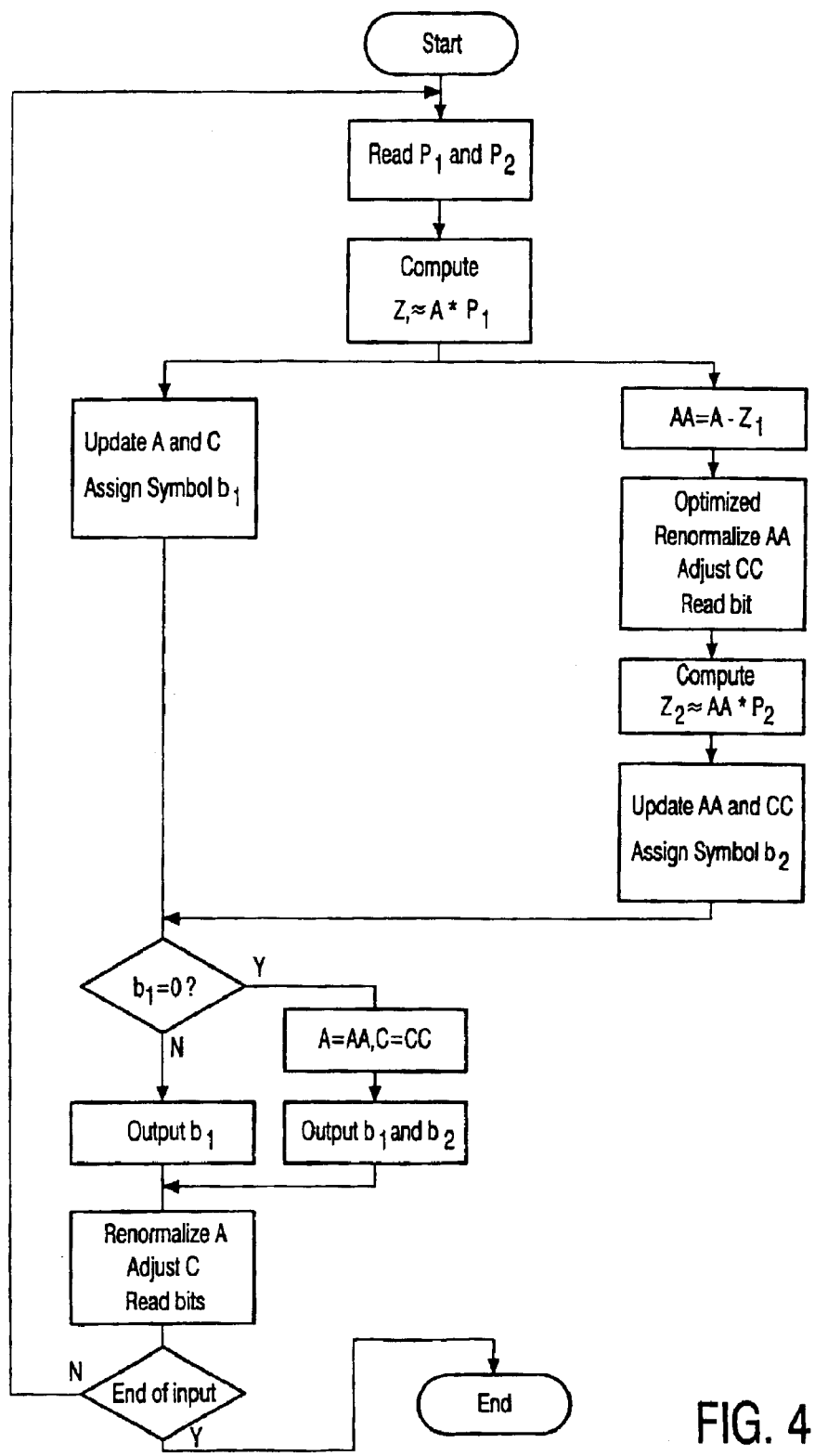
FIG. 4 shows a flowchart of a decoder in accordance with the invention.

FIG. 4 shows a flowchart of a decoder in accordance with the invention adapted to decode one or two bits, depending on the value of the first bit to be decoded. When the first bit turns out to be a one (the least probable symbol, LPS), only this single bit is decoded. When the first bit is a zero (the most probable symbol, MPS), however, always two bits are decoded, irrespective of the value of the second bit. Thus, the groups of decoded bits (MPS,MPS)=(0,0) and (MPS, LPS)=(0,1) are used.

The flowchart has two main branches. The first branch, shown on the left, is the standard flow for decoding a single symbol. The second branch, on the right, speculatively decodes the second bit, assuming that the first decoded symbol has the MPS value. By making this assumption, decoding of the second bit can already start before the first bit has been decoded completely. Thus, when the first bit indeed turns out to have the MPS value, the second bit is also available and can be sent to the output as well. When the first bit turns out to have the LPS value, the results of the second branch are simply discarded.

The flowchart will now be described in a little more detail.

The "Read p1 and p2" block of FIG. 4 retrieves the probabilities values p1 and p2. The probability p1 is just the normal value that is always used for decoding a single bit and is the probability that the first symbol to be decoded has the LPS value. The probability p2 is the probability that the second symbol to be decoded has the LPS value, assuming that the first symbol to be decoded has the MPS value. An external model produces the second probability p2 in the normal way, but looks one step ahead by filling in the MPS value for the unknown first bit.

Figure 1:
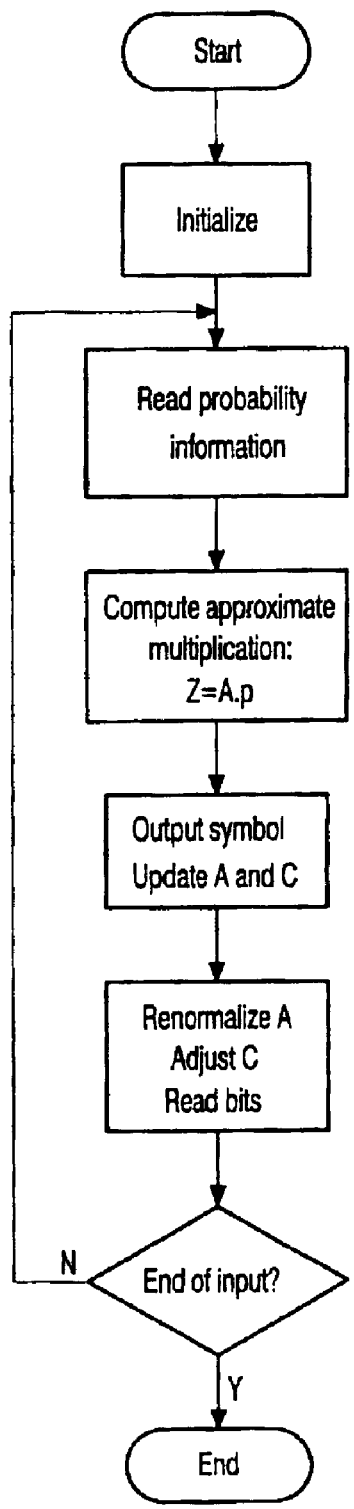
FIG. 1 shows a flowchart of a prior art arithmetic decoder.
Figure 2:
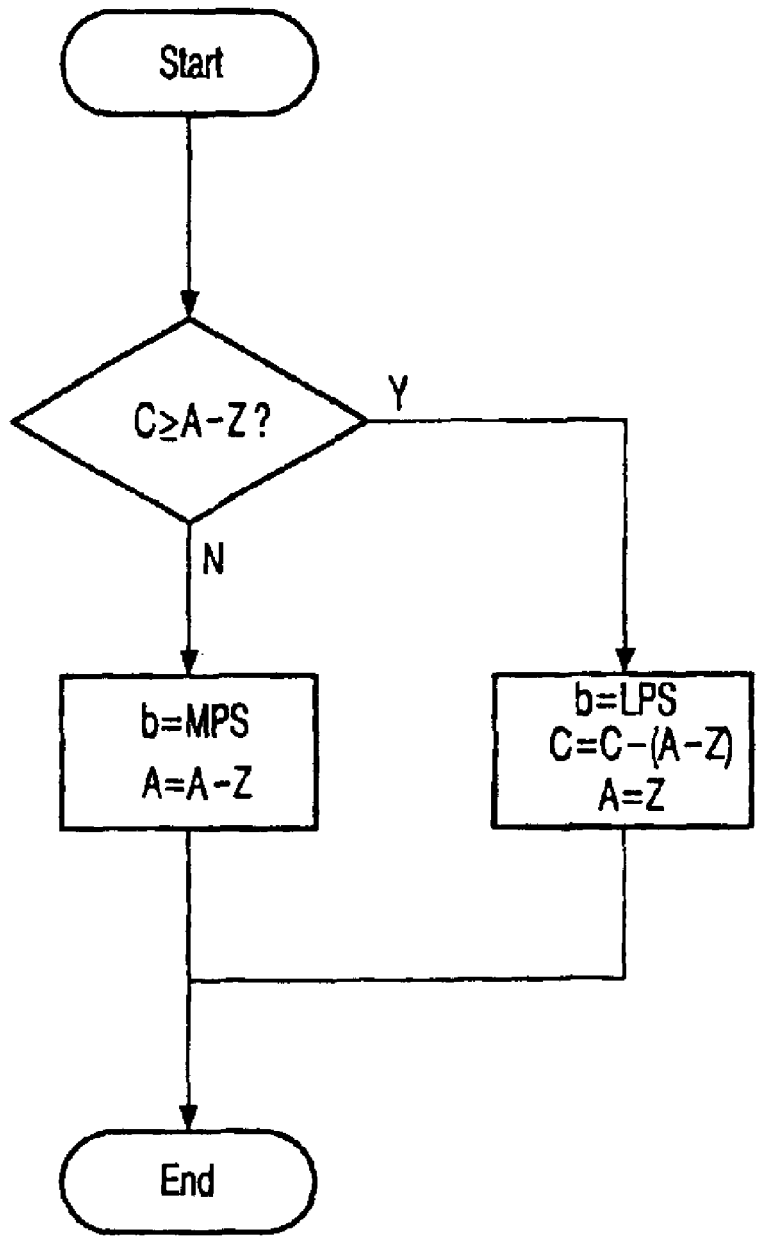
FIG. 2 shows a flowchart for decoder block "Output symbol . . .
Figure 3:
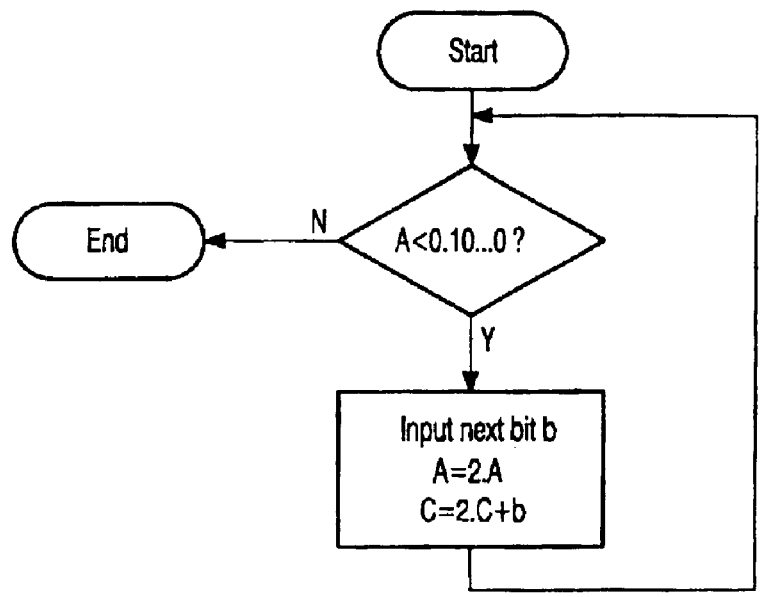
FIG. 3 shows a flowchart of the encoder block denoted "Renormalize . . .
Figure 5:
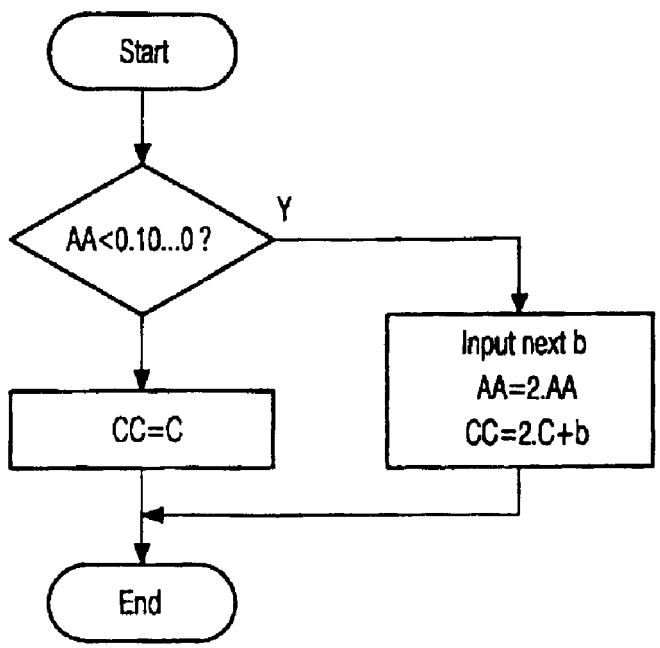
FIG. 5 shows a flowchart of the decoder block denoted "Optimized Renormalize . . .

The left branch now proceeds in a usual manner as described in WO 99/49579 (PHN 16.822). The right branch skips over the decoding of the first bit and immediately adjusts A as if the first bit has the MPS value. This adjusted value AA is then renormalized as usual. However, because for binary data the probability of the MPS (zero in this case) is always at least $\frac{1}{2}$, the renormalization loop is iterated at most once, causing the loop to essentially disappear, as shown in the flow diagram of FIG. 5. After the execution of the "Optimized Renormalized AA . . . " block, the second bit is decoded in the normal way.

When the two parallel branches are joined, it is checked whether the value of the first decoded bit b1 has indeed the MPS value. If not, the results of the second branch are completely discarded and only the first bit bi is outputted. If the speculation was correct and the first bit has the MPS value, both the first (MPS) and second bits are outputted and A and C are adjusted to hold the correct values (AA, CC), which are the same values as they would have after decoding two bits in the traditional sequential way.

Finally, the parameters A and C are renormalized as usual to prepare them in order to obtain the next one or two decoded output symbols.

Figure 6:
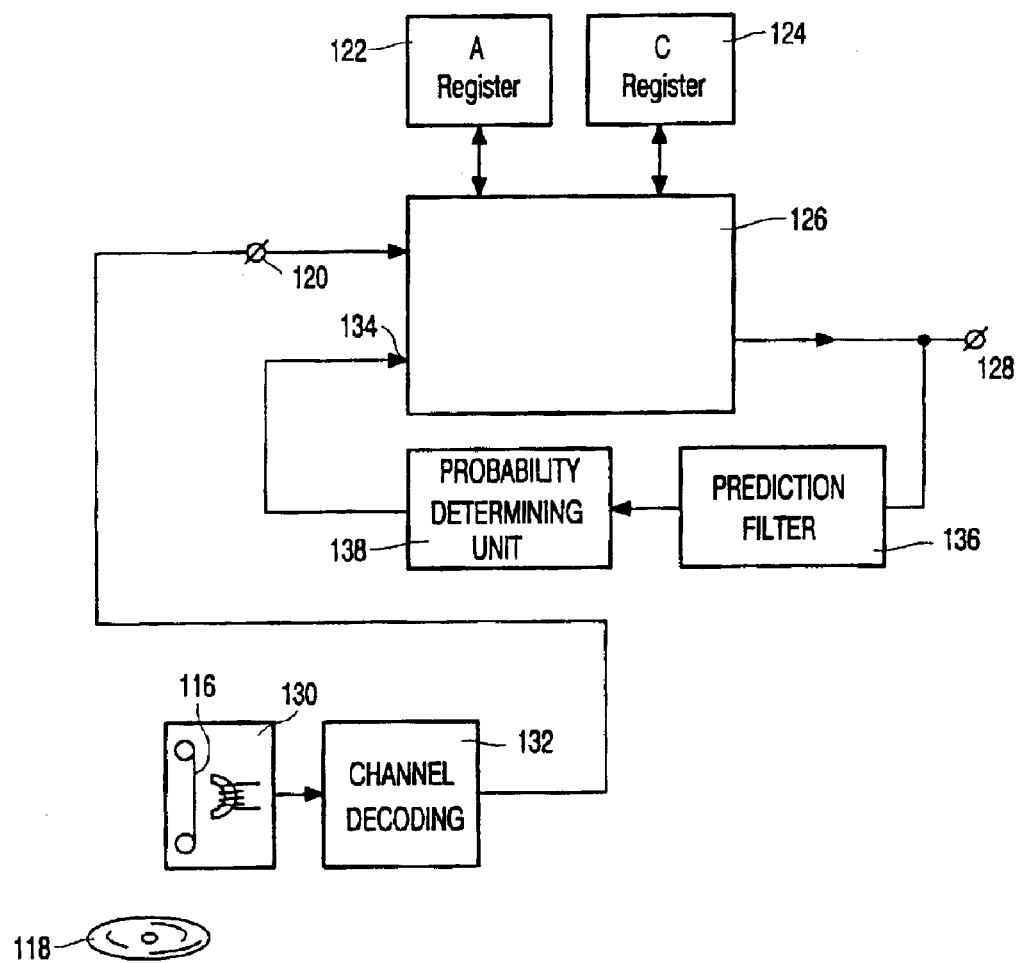
FIG. 6 shows an embodiment of the decoder apparatus.

FIG. 6 shows an embodiment of the decoder apparatus in accordance with the invention. The decoder apparatus has an input terminal 120 for receiving the encoded information signal. Finite-size first and second registers 122 and 124 are present, for storing the A parameter and the C parameter, respectively.

A processing unit 126 is available for carrying out the arithmetic decoding on the encoded information signal received via its input 120, in response to a probability signal supplied to the processing unit 126 via an input 134. The probability signal can be obtained in a well-known way. An example of deriving the probabilities for a 1-bit audio signal is shown in [Bruek97]. In this example, the probabilities are derived from the decoded output signal that is supplied to the output 128, namely, by carrying out a prediction filtering on the decoded output signal in a prediction filter 136 and generating the probability signal in response to the output signal of the prediction filter 136 in the probability determining unit 138. It should be understood that, without going into very much detail as regards the processing unit 126, this unit comprises circuitry for retrieving the values for the A and C parameters from the first and second registers, as well as circuitry for storing the updated and renormalized values for A and C in the first and second registers 122 and 124, respectively, after a symbol has been decoded. The unit 126 further comprises circuitry for carrying out the steps shown in the FIGS. 4, 5, 2 and 3.

Preferably, the decoder apparatus further has a channel decoding unit 132, well-known in the art, for channel decoding (and, if needed, error correcting) the channel encoded information signal into the arithmetically encoded information signal for the arithmetic decoder 126, and a read unit 130 for reading the channel encoded signal from a record carrier, such as the magnetic record carrier 116, or the optical record carrier 118.

Arithmetic coding is applied in most modern lossless and lossy coding schemes for video and audio. It can also be applied in the compression of computer data (such as, e.g., text files). The application envisaged here, is in lossless coding of 1-bit audio signals. Reference is made in this respect to U.S. patent application Ser. No. 08/966,375, now U.S. Pat. No. 6,289,306, corresponding to EP Patent Application No. 97201680.2 (PHN16405), U.S. patent application Ser. No. 08/937,435, corresponding to U.S. Pat. No. 6,269,338, corresponding to International Patent Application No. IB 97/01156 (PHN16452).

While the invention has been described with reference to preferred embodiments thereof, it is to be understood that these are non-limitative examples. Thus, various modifications may become apparent to those skilled in the art, without departing from the scope of the invention, as defined by the claims.

Further, the invention resides in each and every novel feature or combination of features.

References

[Lang 84] G. G. Langdon, "An introduction to arithmetic coding", IBM J. Res. Develop., Vol. 28, pp. 135–149, March 1984.

[Bruek97] F. Bruekers et al, "Improved lossless coding of 1-bit audio signals", presented at 103rd Convention of the AES, Sept., 26–29, 1997, preprint 4563(I-6)

What is claimed is:

1. A method comprising:
   receiving an arithmetically encoded information signal;
   retrieving from finite-size first and second registers, a retrieved A parameter and a retrieved C parameter respectively, the retrieved A parameter having a relationship with a size of a value interval, the retrieved C parameter having a relationship with a boundary of the value interval;
   generating a first probability for a first symbol to be produced, the first probability being the probability that the first symbol has a least likely value; and generating a second probability for a second symbol to be produced, the second probability being the probability that the second symbol has the least likely value; the method being based on the first symbol having the most likely value;
   deriving the first symbol in response to the first probability, the retrieved A parameter, and the retrieved C parameter;
   producing an updated A parameter by updating the retrieved A parameter;
   deriving a temporary A parameter by updating the retrieved A parameter, based on the first symbol having the most likely value;
   deriving a temporary C parameter from the retrieved C parameter;
   deriving the second symbol in response to the second probability, the temporary A parameter, and the temporary C parameter;
   outputting both the first and the second symbol when the first symbol has the most likely value;
   outputting only the first symbol when the first symbol has the least likely value;
   deriving new A and C parameters; and
   storing the new A and C parameter in the first and second register, respectively.

2. The method of claim 1, wherein the first symbol is derived in parallel with: producing an updated A parameter; deriving a temporary C parameter; and deriving the second symbol.

3. The method of claim 1, wherein when only the first symbol is output, then deriving new A and C parameters includes:
   deriving the new A parameter from the updated A parameter; and
   deriving the new C parameter from the retrieved C parameter.

4. The method of claim 1, wherein when both the first and second symbol are output, then deriving new A and C parameters includes:
   deriving the new A parameter from the temporary A parameter; and
   deriving the new C parameter from the temporary C parameter.

5. The method of claim 4, wherein deriving the new A and C parameters includes:
   updating the temporary A parameter;
   updating the temporary C parameter when the second symbol has the least likely value;
   deriving the new A parameter from the temporary A parameter, after the temporary A parameter updating; and
   deriving the new C parameter from the temporary C parameter, after the temporary C parameter updating when the second symbol has the least likely value.

6. The method of claim 1, wherein deriving a temporary A parameter includes:
   multiplying the retrieved A parameter by the first probability so as to obtain a first A parameter;
   subtracting the first A parameter value from the retrieved A parameter to obtain a second A parameter;
   either equating the temporary A parameter to the second A parameter, or multiplying the second A parameter by a first constant, so as to derive the temporary A parameter.

7. The method of claim 6, wherein deriving the temporary C parameter comprises:
   comparing the second A parameter value with a second constant value; and
   when the second A parameter value is greater than or equal to the second constant value, equating the temporary C parameter to the retrieved C parameter; and
   when the second A parameter value is smaller than the second constant value:

reading one bit of the arithmetically encoded information signal;

deriving a C parameter by multiplying the retrieved C parameter by the first constant by shifting the bits of the C parameter by one bit position; and adding the one bit of the arithmetically encoded information signal to the derived C parameter, so as to obtain the temporary C parameter.

8. The method of claim 1, wherein the output symbols are a serial sequence of n-bit symbols, where n is an integer and n≧1.

9. The method of claim 1, wherein:

the first symbol is derived in parallel with: the producing of the updated A parameter; the deriving of the temporary C parameter; and the deriving the second symbol;

when only the first symbol is output, then deriving new A and C parameters includes: deriving the new A parameter from the updated A parameter; and deriving the new C parameter from the retrieved C parameter when both the first and second symbol are output, then deriving the new A and C parameters includes: updating the temporary A parameter; updating the temporary C parameter when the second symbol has the least likely value; deriving the new A parameter from the temporary A parameter, after the temporary A parameter updating; and deriving the new C parameter from the temporary C parameter, after the temporary C parameter updating when the second symbol has the least likely value;

deriving the temporary A parameter includes: multiplying the retrieved A parameter by the first probability so as to obtain a first A parameter; subtracting the first A parameter value from the retrieved A parameter to obtain a second A parameter; either equating the temporary A parameter to the second A parameter, or multiplying the second A parameter by a first constant, so as to derive the temporary A parameter;

deriving the temporary C parameter comprises: comparing the second A parameter value with a second constant value; when the second A parameter value is greater than or equal to the second constant value, equating the temporary C parameter to the retrieved C parameter; when the second A parameter value is smaller than the second constant value: reading one bit of the arithmetically encoded information signal; deriving a C parameter by multiplying the retrieved C parameter by the first constant by shifting the bits of the C parameter by one bit position; and adding the one bit of the arithmetically encoded information signal to the derived C parameter, so as to obtain the temporary C parameter;

the output symbols are a serial sequence of n-bit symbols, where n is an integer and n≧1;

the method further comprises channel decoding a channel encoded arithmetically encoded information signal so as to obtain the arithmetically encoded information signal, prior to arithmetic decoding; and the method further comprises reading the channel encoded arithmetically encoded information signal from a record carrier.

10. Decoding apparatus for carrying out the method of claim 1.

11. The decoding apparatus of claim 10, wherein:

the first symbol is derived in parallel with: the producing of the updated A parameter; the deriving of the temporary C parameter; and the deriving the second symbol;

when only the first symbol is output, then deriving new A and C parameters includes: deriving the new A parameter from the updated A parameter; and deriving the new C parameter from the retrieved C parameter when both the first and second symbol are output, then deriving the new A and C parameters includes: updating the temporary A parameter; updating the temporary C parameter when the second symbol has the least likely value; deriving the new A parameter from the temporary A parameter, after the temporary A parameter updating; and deriving the new C parameter from the temporary C parameter, after the temporary C parameter updating when the second symbol has the least likely value;

deriving the temporary A parameter includes: multiplying the retrieved A parameter by the first probability so as to obtain a first A parameter; subtracting the first A parameter value from the retrieved A parameter to obtain a second A parameter; either equating the temporary A parameter to the second A parameter, or multiplying the second A parameter by a first constant, so as to derive the temporary A parameter;

deriving the temporary C parameter comprises: comparing the second A parameter value with a second constant value; when the second A parameter value is greater than or equal to the second constant value, equating the temporary C parameter to the retrieved C parameter; when the second A parameter value is smaller than the second constant value: reading one bit of the arithmetically encoded information signal; deriving a C parameter by multiplying the retrieved C parameter by the first constant by shifting the bits of the C parameter by one bit position; and adding the one bit of the arithmetically encoded information signal to the derived C parameter, so as to obtain the temporary C parameter;

the output symbols are a serial sequence of n-bit symbols, where n is an integer and n≧1;

the decoding apparatus further comprises channel decoding means for channel decoding a channel encoded arithmetically encoded information signal so as to obtain the arithmetically encoded information signal, prior to arithmetic decoding; and the decoding apparatus further comprises read means for reading the channel encoded arithmetically encoded information signal from a record carrier.

12. Decoding apparatus comprising:

input means for receiving an arithmetically encoded information signal;

finite sized first and second registers, the first register for storing an A parameter, the A parameter having a relationship with a size of a value interval, the second register for storing a C parameter, the C parameter having a relationship with a boundary of the value interval;

retrieval means for retrieving the A parameter and the C parameter from the first and second registers, respectively;

generator means for generating a first probability for a first symbol to be produced, the first probability indicating the probability that the first symbol has the least likely value, and for generating a second probability for a second symbol to be produced, the second probability indicating the probability that the second symbol has the least likely value; the decoding apparatus being based on the first symbol having a most likely value;

first deriving means for deriving the first symbol in response to the first probability, the retrieved A parameter and the retrieved C parameter;

first updating means for updating the retrieved A parameter so as to obtain an updated A parameter;

second updating means for updating the retrieved A parameter so as to obtain a temporary A parameter, based on the first symbol having the most likely value;

second deriving means for deriving a temporary C parameter from the retrieved C parameter;

third deriving means for deriving the second symbol in response to the second probability, the temporary A parameter, and the temporary C parameter;

output means for outputting both the first and the second symbol only when the first symbol has the most likely value and outputting the first symbol only when the first symbol has the least likely value;

fourth deriving means for deriving new A and C parameters; and means for storing the new A and C parameter in the finite sized first and second register, respectively.

13. The decoding apparatus of claim 12, further comprising channel decoding means for channel decoding a channel encoded arithmetically encoded information signal so as to obtain the arithmetically encoded information signal, prior to arithmetic decoding.

14. The decoding apparatus of claim 12, further comprising read means for reading the channel encoded arithmetically encoded information signal from a record carrier.

15. The decoding apparatus of claim 12, wherein:

the first symbol is derived in parallel with: the producing of the updated A parameter; the deriving of the temporary C parameter; and the deriving the second symbol;

when only the first symbol is output, then deriving new A and C parameters includes: deriving the new A parameter from the updated A parameter; and deriving the new C parameter from the retrieved C parameter when both the first and second symbol are output, then deriving the new A and C parameters includes: updating the temporary A parameter; updating the temporary C parameter when the second symbol has the least likely value; deriving the new A parameter from the temporary A parameter, after the temporary A parameter updating; and deriving the new C parameter from the temporary C parameter, after the temporary C parameter updating when the second symbol has the least likely value;

deriving the temporary A parameter includes: multiplying the retrieved A parameter by the first probability so as to obtain a first A parameter; subtracting the first A parameter value from the retrieved A parameter to obtain a second A parameter; either equating the temporary A parameter to the second A parameter, or multiplying the second A parameter by a first constant, so as to derive the temporary A parameter;

deriving the temporary C parameter comprises: comparing the second A parameter value with a second constant value; when the second A parameter value is greater than or equal to the second constant value, equating the temporary C parameter to the retrieved C parameter; when the second A parameter value is smaller than the second constant value: reading one bit of the arithmetically encoded information signal; deriving a C parameter by multiplying the retrieved C parameter by the first constant by shifting the bits of the C parameter by one bit position; and adding the one bit of the arithmetically encoded information signal to the derived C parameter, so as to obtain the temporary C parameter;

the output symbols are a serial sequence of n-bit symbols, where n is an integer and $n \geq 1$;

wherein the decoding apparatus further comprises channel decoding means for channel decoding a channel encoded arithmetically encoded information signal so as to obtain the arithmetically encoded information signal, prior to arithmetic decoding; and wherein the decoding apparatus further comprises read means for reading the channel encoded arithmetically encoded information signal from a record carrier.

* * * * *